(12) United States Patent
Schrank et al.

(10) Patent No.: US 9,684,074 B2
(45) Date of Patent: Jun. 20, 2017

(54) OPTICAL SENSOR ARRANGEMENT AND METHOD OF PRODUCING AN OPTICAL SENSOR ARRANGEMENT

(71) Applicant: ams AG, Unterpremstaetten (AT)

(72) Inventors: Franz Schrank, Graz (AT); Eugene G. Dierschke, Dallas, TX (US); Martin Schrems, Eggersdorf (AT)

(73) Assignee: AMS AG, Unterpremstaetten (AT)

( * ) Notice: Subject to any disclaimer, the term of this patent is extended or adjusted under 35 U.S.C. 154(b) by 0 days.

(21) Appl. No.: 15/101,893

(22) PCT Filed: Dec. 3, 2014

(86) PCT No.: PCT/EP2014/076420
§ 371 (c)(1),
(2) Date: Jun. 3, 2016

(87) PCT Pub. No.: WO2015/082549
PCT Pub. Date: Jun. 11, 2015

(65) Prior Publication Data
US 2016/0306042 A1    Oct. 20, 2016

Related U.S. Application Data

(60) Provisional application No. 61/912,099, filed on Dec. 5, 2013.

(30) Foreign Application Priority Data

Dec. 20, 2013   (EP) ..................................... 13199086

(51) Int. Cl.
*H01L 33/00*     (2010.01)
*G01S 17/02*     (2006.01)
(Continued)

(52) U.S. Cl.
CPC .......... *G01S 17/026* (2013.01); *G01S 7/4813* (2013.01); *H01L 25/167* (2013.01);
(Continued)

(58) Field of Classification Search
None
See application file for complete search history.

(56) References Cited

U.S. PATENT DOCUMENTS 6,376,917 B1    4/2002  Takeshita et al.
6,486,467 B1   11/2002  Speckbacher et al.
(Continued)

FOREIGN PATENT DOCUMENTS

CN    101936752 A    1/2011
CN    102364358 A    2/2012
(Continued)

OTHER PUBLICATIONS

Boschman Technologies; "Conventional Transfer Molding", retrieved from <http://www.boschman.nl/index.php/molding-principles/conventional-tr . . . > on Jan. 27, 2014, 1 pg.
(Continued)

*Primary Examiner* — Minh-Loan Tran
(74) *Attorney, Agent, or Firm* — McDermott Will & Emery LLP

(57) ABSTRACT

An optical sensor arrangement, in particular an optical proximity sensor arrangement comprises a three-dimensional integrated circuit further comprising a first layer comprising a light-emitting device, a second layer comprising a light-detector and a driver circuit. The driver circuit is electrically connected to the light-emitting device and to the light-detector to control the operation of the light-emitting device and the light-detector. A mold layer comprising a first light-barrier between the light-emitting device and the light-
(Continued)

detector configured to block light from being transmitted directly from the light-emitting device to the light-detector.

14 Claims, 5 Drawing Sheets

(51) Int. Cl.
| | |
|---|---|
| H01L 31/0203 | (2014.01) |
| H01L 33/52 | (2010.01) |
| H01L 31/0216 | (2014.01) |
| H01L 33/48 | (2010.01) |
| G01S 7/481 | (2006.01) |
| H01L 25/16 | (2006.01) |
| H01L 31/12 | (2006.01) |
| H01L 31/14 | (2006.01) |
| H01L 27/144 | (2006.01) |
| H01L 31/02 | (2006.01) |
| H01L 31/0232 | (2014.01) |
| H01L 31/173 | (2006.01) |

(52) U.S. Cl.
CPC ...... *H01L 27/1443* (2013.01); *H01L 31/0203* (2013.01); *H01L 31/02005* (2013.01); *H01L 31/02164* (2013.01); *H01L 31/02165* (2013.01); *H01L 31/02327* (2013.01); *H01L 31/125* (2013.01); *H01L 31/14* (2013.01); *H01L 31/173* (2013.01); *H01L 33/483* (2013.01); *H01L 33/52* (2013.01); *H01L 2224/16* (2013.01); *H01L 2224/48091* (2013.01); *H01L 2924/0002* (2013.01)

(56) References Cited

U.S. PATENT DOCUMENTS

| | | | |
|---|---|---|---|
| 7,030,359 B2 | 4/2006 | Roemhild | |
| 7,453,079 B2* | 11/2008 | Sano | G01V 8/12 |
| | | | 250/551 |
| 7,683,449 B2 | 3/2010 | Minixhofer | |
| 8,212,202 B2 | 7/2012 | Wong et al. | |
| 8,803,206 B1 | 8/2014 | Or-Bach et al. | |
| 8,928,159 B2 | 1/2015 | Chang et al. | |
| 2006/0043606 A1 | 3/2006 | Imaoka et al. | |
| 2007/0007641 A1 | 1/2007 | Lee et al. | |
| 2008/0097172 A1* | 4/2008 | Sawada | G01N 21/49 |
| | | | 600/310 |
| 2010/0127296 A1* | 5/2010 | Hioki | H01L 25/167 |
| | | | 257/98 |
| 2010/0171226 A1 | 7/2010 | West et al. | |
| 2010/0258710 A1 | 10/2010 | Wiese et al. | |
| 2011/0024887 A1 | 2/2011 | Chi et al. | |
| 2011/0024916 A1 | 2/2011 | Marimuthu et al. | |
| 2011/0089531 A1 | 4/2011 | Hillman et al. | |
| 2011/0186998 A1 | 8/2011 | Wu et al. | |
| 2012/0056312 A1 | 3/2012 | Pagaila et al. | |
| 2012/0086131 A1 | 4/2012 | Wang | |
| 2012/0182066 A1 | 7/2012 | Merkle et al. | |
| 2013/0001398 A1* | 1/2013 | Wada | G02B 19/0085 |
| | | | 250/206.1 |
| 2013/0009173 A1 | 1/2013 | Vittu et al. | |
| 2016/0284920 A1* | 9/2016 | Saugier | H01L 31/167 |

FOREIGN PATENT DOCUMENTS

| | | |
|---|---|---|
| CN | 102738132 A | 10/2012 |
| DE | 3633181 A1 | 4/1988 |
| WO | 2011/097089 A2 | 8/2011 |

OTHER PUBLICATIONS

Boschman Technologies; "Film-Assisted Molding (FAM) Technologies", retrieved from <http://www.boschman.nl/index.php/molding-principles/film-assisted-m . . . > on Jan. 27, 2014, 1 pg.

Murugesan, M. et al., "High-Step-Coverage Cu-lateral Interconnections Over 100um Thick Chips on a Polymer Substrate—An Alternative Method to Wire Bonding", IOP Publishing, Journal of Micromechanics and Microengineering, 2012, pp. 1-9.

Chen, Q. et al., "Chip-To-Wafer (C2W) 3D Integration with Well-Controlled Template Alignment arid Wafer-Level Bonding", IEEE, 2011. pp. 1-6.

Shigetou, A. et al., "Homo-Heterogeneous Bondring of Cu, Si02,and Polyimide by Low Temperature Vapor-Assisted Surface Activation Method", IEEE, 2011, pp. 32-36.

Van Weelden, T. et al., "The Encapsulation of MEMS/Sensors and the Realization of Molded Vias on Package Level and Wafer Level with Film Assisted Molding", 2010, 7 pgs.

* cited by examiner

OPTICAL SENSOR ARRANGEMENT AND METHOD OF PRODUCING AN OPTICAL SENSOR ARRANGEMENT

This invention relates to an optical sensor arrangement and a method of producing an optical sensor arrangement. In particular, the invention relates to an optical proximity sensor arrangement and a method of producing an optical proximity sensor arrangement.

BACKGROUND OF THE INVENTION

An optical proximity sensor is a sensor able to detect the presence of nearby objects by means of electromagnetic radiation without any physical contact. Typically, a proximity sensor emits a continuous or pulsed electromagnetic field, e.g. infrared, and detects changes in the field or return signal. The term "optical" in this respect relates to the infrared, visible and ultraviolet part of the electromagnetic spectrum.

Currently, typical optical proximity sensors are realized with multi-chip packages based on printed circuit boards (PCB) which are over-molded by common molding techniques. These packages, however, are bulky and have rather big footprint. On the other side optical proximity sensors find increased application in modern mobile devices like smartphones, personal digital assistants (PDA), laptops and the like. With such devices there is a strong need to reduce size and increase functionality per area.

SUMMARY OF THE INVENTION

An optical sensor arrangement, in particular an optical proximity sensor arrangement, comprises a three-dimensional integrated circuit. The three-dimensional integrated circuit further comprises a first layer, a second layer and a mold layer. The first layer comprises a light-emitting device. The second layer comprises a light detector and a driver circuit. The driver circuit is electrically connected to the light-emitting device and to the light-detector. The mold layer further comprises a first light barrier between the light-emitting device and the light-detector. The first light barrier is configured to block light from transmitting directly from the light-emitting device to the light-detector.

The light-emitting device can be a light emitting diode emitting visible light or infrared light. The term "light" denotes electromagnetic radiation in the infrared (IR), visible and ultraviolet (UV) spectrum. Infrared light emitting diodes can be used with the optical sensor arrangement. These can be produced at low cost and emit light not visible to the human eye. The light-detector can be a photo-diode, charge coupled device (CCD) or complementary metal oxide semiconductor (CMOS) type light detector.

In operation the light-emitting device emits light, either continuously or in a pulsed fashion. Due to the first light barrier in the mold layer the light-detector detects light emitted from the light-emitting device only if it gets reflected by a proximity object, i.e. the first light barrier blocks light from being transmitted directly from the light-emitting device to the light-detector. However, the light-detector is typically also exposed to ambient light from the surroundings of the optical sensor arrangement. To account for this contribution the control device can optionally be configured to record the amount of ambient light and correct for it. For example, this can be achieved by letting the light-emitting device emit pulses of a certain duration. During the pauses when no light is emitted the light-detector only detects ambient light.

Due to the three-dimensional integration of the optical sensor arrangement the sensor can be packaged into a rather small volume as compared to multichip packages. This results in a rather small footprint as the respective layer can be heterogeneously stacked and/or embedded. By means of the mold layer, the overall layout of the sensor arrangement can be largely adapted and its optical properties can be fine-tuned. The proposed design leads to rather low heights when compared to multichip packages. Additionally, the optical sensor arrangement can be produced with few process steps and at reduced cost. The mold layer effectively protects or seals the optical sensor arrangement from environmental influences. Furthermore, the mold layer provides a shield from unwanted ambient light, for instance, infrared radiation which does not originate from the light-emitting device.

The term "three-dimensional integrated circuit" (3D-IC) refers to a chip with two or more layers of active electronic components which are integrated either vertically or horizontally into a single integrated circuit. The term "layer" relates to the structure into which a circuit can be integrated, for example a substrate. Finally, the term "molding" refers to the process of shaping a mold structure from a raw mold material using a rigid frame or model, called a pattern.

In an embodiment of the optical sensor arrangement the mold layer comprises an optically opaque mold material. The term "opaque" describes a material property of the mold material so that the mold layer is neither transparent not allowing any light to pass through nor translucent allowing some light to pass through. One possible mold material is plastics.

In another embodiment of the optical sensor arrangement the mold layer comprises a wafer level mold structure. The wafer level mold structure is produced at a wafer level by using molding, in particular transfer molding techniques, such as film-assisted molding, for instance. Briefly, film-assisted molding uses a plastic film which is attached to an inner surfaces of the mold by vacuum before a layer like the first and second layer, i.e. the products to be encapsulated, are loaded into the mold. Then, the mold is closed, effectively leaving a cavity in the (inverse) shape of the mold layer to be produced. Finally, the cavity is filled with liquid mold material and, after the mold material has cured, the mold layer has taken the shape forced by the mold, e.g. the first light barrier is designed into the mold layer.

In a further embodiment of the optical sensor arrangement the mold layer is at least partially connected to a main surface of the second layer. The mold layer comprises a first aperture to which the first layer is attached. The first aperture is attached to the first layer in such a way that light from the light-emitting device can be emitted through the first aperture. The first aperture establishes an optical path for emission of light by the light-emitting device. At the same time the aperture in the mold layer blocks light from reaching the light-detector directly.

In another embodiment of the optical sensor arrangement the mold layer comprises a second aperture to which the light-detector is attached. The second aperture assures that light can be detected by means of the light-detector. This way the mold layer can be extended along the main surface of the second layer. The second aperture assures that light can reach the light-detector while blocking direct transmission from the light-emitting device.

In another embodiment of the optical sensor arrangement the second layer comprises a substrate into which the light-detector and the control circuit are integrated. In this way the control circuit and the light-detector can be realized with a single chip which further reduces the footprint of the optical sensor arrangement. As an alternative, the control circuit and the light-detector can be integrated into a recess formed in the substrate. Electrical connections can be designed into the substrate with known techniques.

In another embodiment of the optical sensor arrangement the substrate comprises an active interposer. In particular, the active interposer may be further connected to a redistribution layer or an embedded wafer level wall grid array. The interposer is an electrical interface routing between one socket and connection of the electronic circuits to another. A redistribution layer is a metal layer on a layer that makes the input/output pads of the integrated circuit available at other locations along the layer. The embedded wafer level ball grid array (eWLB) is the result of a packaging technology for integrated circuits interconnecting pads of an integrated circuit. When an integrated circuit is manufactured it usually has a set of Input/Output pads that are area wire bonded to pins of the package. By means of the interposer an extra layer of wiring on the chip is provided enabling bonding out from different locations on the chip making chip-to-chip bonding simpler.

In another embodiment of the optical sensor arrangement the light-emitting device is electrically connected to the second layer by means of a metallization structured topology, a bond wire or a redistribution layer. The metallization structured topology comprises a structured metallization and provides electrical connectivity between the first and second layer.

In another embodiment of the optical sensor arrangement the first layer is stacked onto the main surface of the second layer. In an alternative, the first layer is embedded into a recess formed in the second layer. In a further alternative, the first layer is stacked onto a further main surface of the second layer opposite to the main surface. In this case the first aperture extends through the second layer.

In another embodiment of the optical sensor arrangement the second layer comprises a second light barrier. While the first light barrier is designed to block light from being directly transmitted to the light detector via the mold layer the second light barrier has a similar purpose. It effectively blocks light from being directly transmitted to the light detector via the second layer.

The material of the second layer could eventually not be completely opaque to the light emitted by the light detector. For example, silicon is transparent to infrared to some extent. The second light barrier effectively reduces the amount of light reaching the light detector via the second layer material.

In another embodiment of the optical sensor arrangement the second light barrier comprises through-silicon vias designed into the substrate. A through-silicon via, or TSV for short, is an electrical connection, via (Vertical Interconnect Access), passing completely through a silicon wafer or die. The second layer in this case comprises a silicon wafer or die. The electrical path of the TSV features absorbance of light, in particular infrared, to a high extent.

In another embodiment of the optical sensor arrangement the light-detector and/or light-emitting device are covered by an optical element. The optical element is a lens and/or zone plate. In particular, the lens can be a nano-imprinted lens.

A method of producing an optical sensor arrangement, in particular a method of producing an optical proximity sensor arrangement, comprises the step of integrating a light-emitting device into a first layer. A light-detector and a driver circuit are integrated into a second layer. The light-emitting device and the light-detector are then electrically connected. The method further comprises molding a mold layer comprising a first light barrier between the light-emitting device and the light-detector. Said mold layer is configured to block light from being transmitted directly from the light-emitting device to the light-detector. Finally, the first layer, the second layer and the mold layer are integrated into a three-dimensional integrated circuit.

Due to the three-dimensional integration of the optical sensor arrangement the sensor can be packaged into a rather small volume as compared to multichip packages. This results in a rather small footprint as the respective layer can be heterogeneously stacked and/or embedded. By means of the mold layer, the overall layout of the sensor arrangement can be largely adapted and its optical properties can be fine-tuned. The proposed design leads to rather low heights when compared to multichip packages. Additionally, the optical sensor arrangement can be produced with few process steps and at reduced cost. The mold layer effectively protects or seals the optical sensor arrangement from environmental influences. Furthermore, the mold layer provides a shield from unwanted ambient light, for instance, infrared radiation which does not originate from the light-emitting device.

In an embodiment of the method of producing an optical sensor arrangement the molding involves wafer-level molding, in particular wafer-level molding using an optically opaque material. Wafer-level molding involves molding at a wafer level, for example transfer molding techniques, such as film-assisted molding.

In another embodiment the first layer is stacked onto the second layer, in particular stacked by means of die-to-wafer stacking. The first layer is then electrically connected to the second layer by means of a metallization structured topology, a bond wire or a redistribution layer, in particular by means of a metallization structured topology based on through-silicon vias. Alternatively, the first layer is embedded into a recess formed on the second layer.

In another embodiment of the method the mold layer is connected, at least partially, to a main surface of the second layer. A first aperture is provided in the mold layer to which the first layer is attached such that light from the light-emitting device can be emitted through the first aperture. Alternatively, or in addition, a second aperture can be provided to which the light-detector is attached such that light can be detected by means of the light-detector.

In the following, the principle presented above will be described in more detail with respect to drawings in which exemplary embodiments are presented. Elements corresponding to similar elements of among the embodiments are designated with the same reference numerals.

DETAILED DESCRIPTION

Figure 1A:
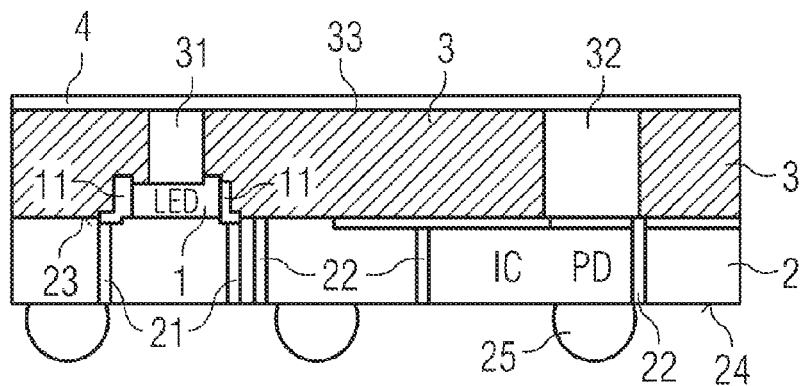
FIGS. 1A, 1B, 1C show embodiments of the optical sensor arrangement.

FIG. 1A shows an embodiment of the optical sensor arrangement. The optical sensor arrangement comprises a three-dimensional integrated circuit with a first layer 1, a second layer 2, and a mold layer 3, optionally covered by a cover layer 4.

The first layer 1 comprises a light-emitting device LED which can be a light-emitting diode. The light-emitting diode emits visible light but in the field of optical proximity sensors emission of (near) infrared light are often used. IR diodes are both cheap and emit light that is not visible to the human eye. The latter is a beneficial aspect from a design point of view as optical proximity sensors typically reside behind a dark cover. If said cover is optically opaque to visible light but transparent to IR, the structure and circuitry are invisible to users and, thus, do not interfere with smartphone design, for instance.

The second layer 2 comprises a silicon substrate and has a main surface 23 and a further main surface 24 opposite to the main surface 23. The second layer 2 comprises a light-detector PD and a driver circuit IC. In this embodiment the light-detector PD and the driver circuit IC are integrated into the second layer 2. Alternatively, both components, LED, IC could be integrated into separate integrated circuits and connected to each other. The term "second layer" is used to cover both ways of integration.

The light-detector PD comprises a photo-diode which is sensitive to light to be emitted from the light-emitting device LED. Thus, in the this exemplary embodiment the photo-diode is sensitive to (near) infrared light. Alternatively, the light-detector PD may be a charge coupled device (CCD) or a CMOS light sensor. Typically, the latter devices are or can be manufactured to be sensitive to infrared. The driver circuit IC comprises means to control and operate both the light-detector PD and the light-emitting device LED. In this respect, the second layer 2 comprises electrical connections between the driver circuit IC and both light-detector PD and the light-emitting device LED.

The first layer 1 provides connection pads to the second layer 2 to allow the light emitting device LED to be operated. The connection to the second layer 2 is established through a metallization structured topology 11 which will be discussed in more detail with respect to FIGS. 7 to 9. Briefly, the first layer 1, comprising the light emitting device LED, is bonded onto the second layer 2. The electrical connection is realized via the metallization structured topology 11 which connects the light-emitting device LED to the through-silicon via (TSV) connections 21. The metallization structured topology 11 is produced by means of high topology lithography, like EVG Nano spray lithography, and further by spray-coating or sputtering of a metal layer.

The second layer 2 constitutes an active interposer. Apart from the through-silicon via (TSV) connections 21, the further main surface 24 comprises a redistribution layer or, alternatively, or may be connected to an embedded wafer level ball grid array, in order to make input/output pads available at locations of the optical sensor arrangement. This concerns electrical connections within the optical sensor arrangement, e.g. between the light-emitting device LED, the driver circuit IC and the light detector PD, as well as connections to further external circuits in a system into which the optical sensor arrangement is embedded, for example, a smartphone, mobile phone or mobile computer. Connections to such other circuits are established via bumps 25, located at the further main surface 24.

The mold layer 3 covers a stack of first and second layer 1, 2. Furthermore, the mold layer 3 has a characteristic shape which basically defines the optical paths within the optical sensor arrangement. The specifics of the mold shape is determined by the field of application of the optical sensor arrangement, e.g. optical proximity detection. The stack of first and second layer 1, 2 and mold layer 3 make up a three-dimensional integrated circuit.

The mold layer 3 constitutes a wafer level mold structure which is produced at a wafer level by using molding techniques like transfer molding such as film-assisted molding. This way typically more than one optical sensor arrangement is produced at a time and individual ones are cut out by sawing. The shape of a mold determines the structure of the mold layer 3. In film-assisted molding, for example, a plastic film which is attached to an inner surface of the mold by vacuum before the first and second layer 1, 2, i.e. the products to be encapsulated, are loaded into the mold. Then the mold is closed, effectively leaving a cavity of the (inverse) shape of the mold layer 3 to be produced. Finally, the cavity is filled with liquid mold material and, after the mold material has cured, the mold layer 3 has taken the shape forced by the mold.

The mold is structured so that it shapes the mold layer 3 to allow light emitted from the light-emitting device LED to leave the arrangement. At the same time it allows light to enter the arrangement and be detected by the light-detector PD. This functionality is implemented by means of a first and second aperture 31, 32 in the mold layer 3, respectively. In fact, the light-emitting device LED and the light-detector PD are placed in front of the first and second aperture 31, 32, respectively. Additionally, a first light barrier 33 is designed into the mold layer 3 which resides between light-emitting device LED and the light-detector PD to block light from being transmitted directly between these two components. In this embodiment the first light barrier 33 is framed by the first and second apertures 31, 32. The mold layer 3 comprises an optically opaque material so that no light can pass the first light barrier 33. One possible material is plastics.

In addition to the first light barrier 33, the second layer 2 comprises one or more second light barriers 22. Conveniently, this second light barrier 22 comprises through silicon vias in the shape of rectangles or rings around the light-emitting device LED and/or the light detector PD. This way, light emitted from the light-emitting device LED is blocked from reaching the light detector PD by way through the material of the second layer 2. The second layer 2 is typically made of silicon substrate which to some degree is transparent to light, in particular infrared light. The second light barrier 22 thus further reduces optical crosstalk.

Optionally, the optical sensor arrangement can be covered by the cover layer 4. The cover layer 4 comprises a transparent or at least translucent mold material and seals the optical sensor arrangement of its surroundings. In particular, mold material can also fill the first and/or second aperture 31, 32. Part of the cover can be in the form of optical elements 41, which may have the shape of an optical lens and/or a zone plate like a Fresnel lens. Examples are discussed with respect to further embodiments and can be used with the present embodiment of FIG. 1A as well.

Figure 1B:
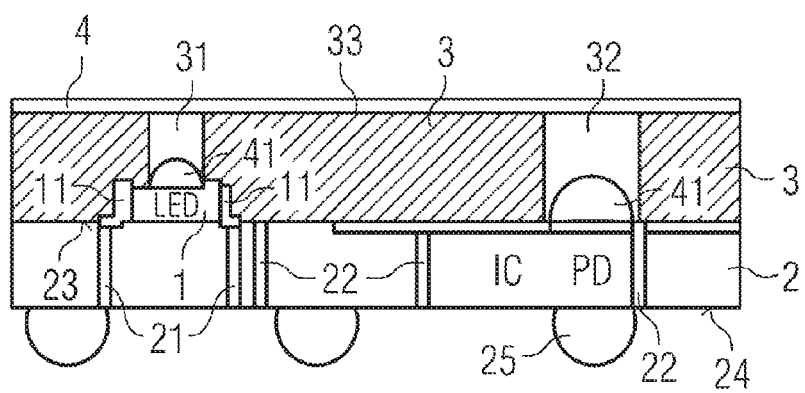

For example, the embodiment shown in FIG. 1B is the same as of FIG. 1A except that optical elements 41 (e.g. lenses) are connected to the light-emitting device LED and the light detector PD, respectively. In this embodiment the lenses reside inside the first and second aperture 31, 32, respectively. The lenses serve as optical elements 41 shaping beams of light emitted by the light-emitting device LED and/or detected by the light detector PD to improve signal-to-noise ratio and reduce optical cross-talk.

Figure 1C:
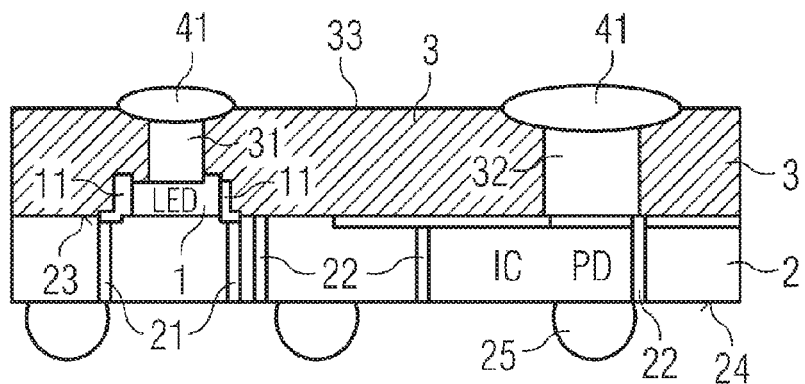

The embodiment shown in FIG. 1C is based on that of FIG. 1C. Here, the lenses 41 reside on top of the first and second aperture 31, 32, thereby sealing the optical sensor arrangement from its environment.

Figure 2:
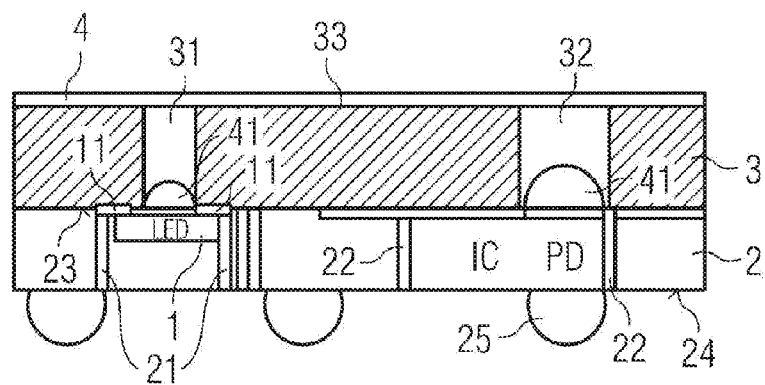
FIG. 2 shows another embodiment of the optical sensor arrangement.

FIG. 2 shows another embodiment of the optical sensor arrangement. This embodiment is based on the ones disclosed in FIGS. 1A to 1C and only differs in the connection of the first layer 1 to the second layer 2. The first layer 1 resides in a cavity which is etched into the second layer 2 in order to have the same surface height as the first layer 1. The light-emitting device LED is bonded into the cavity and electrically connected by means of a low topology lithography for metal contact as discussed above. The optical elements can be provided in the way discussed with respect to FIGS. 1A to 1C.

Figure 3:
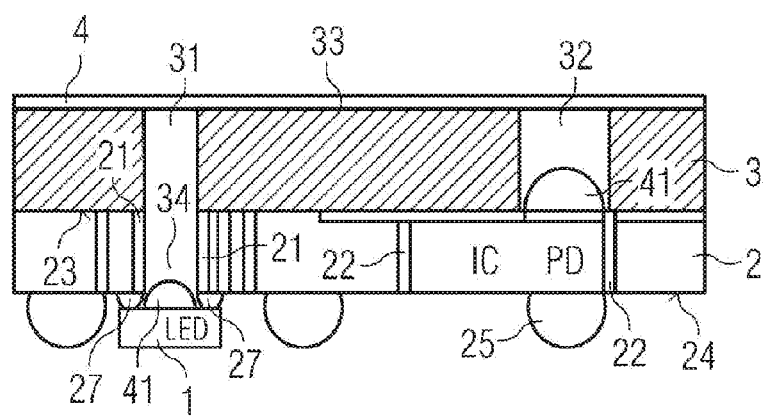
FIG. 3 shows another embodiment of the optical sensor arrangement.

FIG. 3 shows another embodiment of the optical sensor arrangement. This embodiment is based on the ones disclosed in FIGS. 1A to 1C but differs in the way the first layer 1 is connected to the second layer 2. The first aperture 31 is cut through the second layer 2 and the mold layer 3 completely leaving a hole 34. The additional hole 34 in the second layer 2 is e.g. formed by a wide diameter TSV and a diffractive RIE etch before or after wafer level molding selective to the mold compound.

The first layer 1 is connected to the second layer 2 in front of the hole 34 in a flip-chip fashion prior or after bumping. For this process the first layer 1 has solder pads and is then electrically connected to the second layer by (micro) bumps 27 on the further main surface 24 which provides metal contact via low topology lithography. Optionally, the optical sensor arrangement is provided with optical elements 41 like lenses or zone plates as discussed above with respect to FIGS. 1A to 1C.

Figure 4:
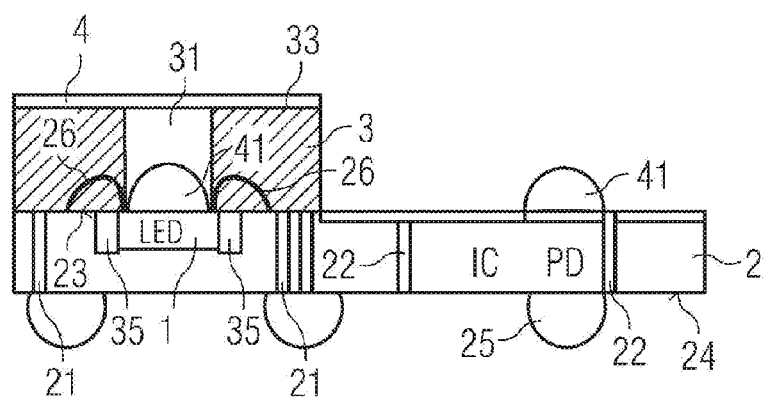
FIG. 4 shows another embodiment of the optical sensor arrangement.

FIG. 4 shows another embodiment of the optical sensor arrangement. This embodiment is based on the one disclosed in FIG. 2. The first layer 1 resides in a cavity which is etched into the second layer 2. Different to FIG. 2 the cavity for the first layer 1 is enlarged in order to have mold determining side walls 35 with respect to the first layer 1. The light-emitting device LED is wire bonded 26 to electrically connect to the second layer 2.

Furthermore, the mold layer 3 covers only part of the main surface 23 and there is no second aperture 32. Optionally, the optical sensor arrangement is provided with optical elements like lenses or zone plates as discussed above with respect to FIGS. 1A to 1C. Consequently, the optional cover 4 also only covers part of the mold layer 3.

Figure 5:
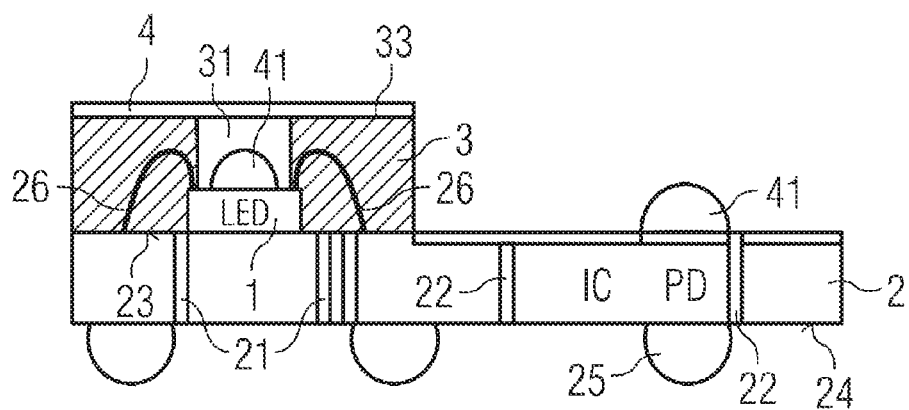
FIG. 5 shows another embodiment of the optical sensor arrangement.

FIG. 5 shows another embodiment of the optical sensor arrangement based on the one disclosed in FIG. 4. There is no cavity, however, and the first layer is directly connected on top of the second layer 2. The electrical connection is established via wire bonds 26. Similar to FIG. 4 the mold layer 3 is only around the first layer 1 as first light barrier 33 but not over the remaining surface of the second layer 2 in order to minimize wafer bow due to the stress of the molding.

Figure 6:
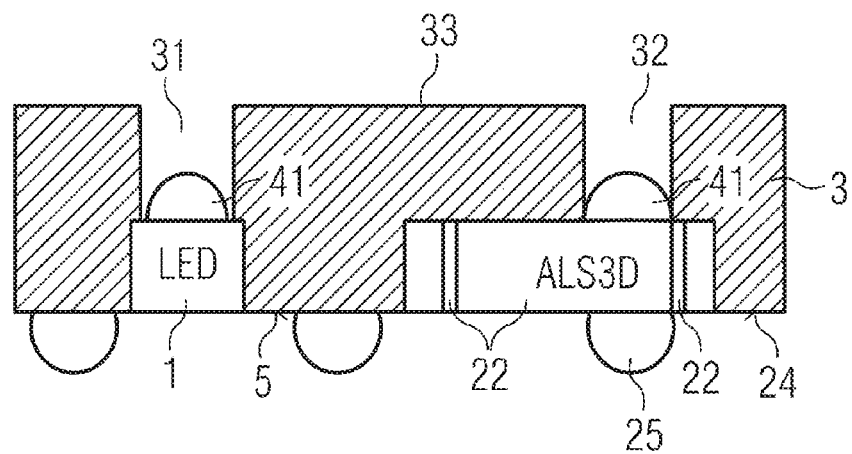
FIG. 6 shows another embodiment of the optical sensor arrangement.

FIG. 6 shows another embodiment of the optical sensor arrangement. This embodiment is somewhat different from the ones presented with respect to FIGS. 1A to 5. In the integration of the latter embodiments the first and second layer 1, 2 have been stacked and electrically connected, e.g. via the active interposer. In this embodiment the first layer 1 and the second layer 2 are overmolded by the mold layer 3. The three-dimensional integrated circuit is thus established in a horizontal arrangement of first and second layer 1, 2 and interconnection via the mold layer 3. Electrical connection are provided via a redistribution layer or an embedded wafer level ball grid array along another main surface 5 on the bottom side of the optical sensor arrangement. Bump connections are provided on this another main surface 5.

The first and second aperture 31, 32, and optionally the cover 4, are provided according to the design principles discussed above. Also optical elements can be attached to both the first layer 1 and the second layer 2 as discussed above.

Typical dimensions of the embodiments of the optical sensor arrangement may be as follows. The light emitting diode can be a GaN light emitting diode having a thickness of several 10 µm to 180 µm. The lower thickness can be realized e.g. for new GaN on Si LEDs. The LED footprint is typically smaller than 350 µm times 350 µm. Larger bumps have about 100 to 300 µm whereas microbumps for LED mounting are smaller than 50 µm. The wafer level molded layer 3 and its flight barrier have 100 to 1000 µm height.

The operation of the different embodiments of the optical sensor arrangement for proximity detection is similar. The light-emitting device LED emits light, either continuously or in a pulsed fashion. Due to the first light barrier 33 in the mold layer 3 the light-detector PD detects light emitted from the light-emitting device LED only if it gets reflected by a proximity object, i.e. the first light barrier blocks light from being transmitted directly from the light-emitting device to the light-detector. However, the light-detector PD is typically also exposed to ambient light from the surroundings of the optical sensor arrangement. To account for this contribution the control device IC comprises means to record the amount of ambient light and correct for it. For example, this can be achieved by letting the light-emitting device LED emit pulses of a certain duration. During the pauses when no light is emitted the light-detector LED only detects ambient light. The control device IC typically comprises further means for signal processing not shown and discussed here.

Figure 7:
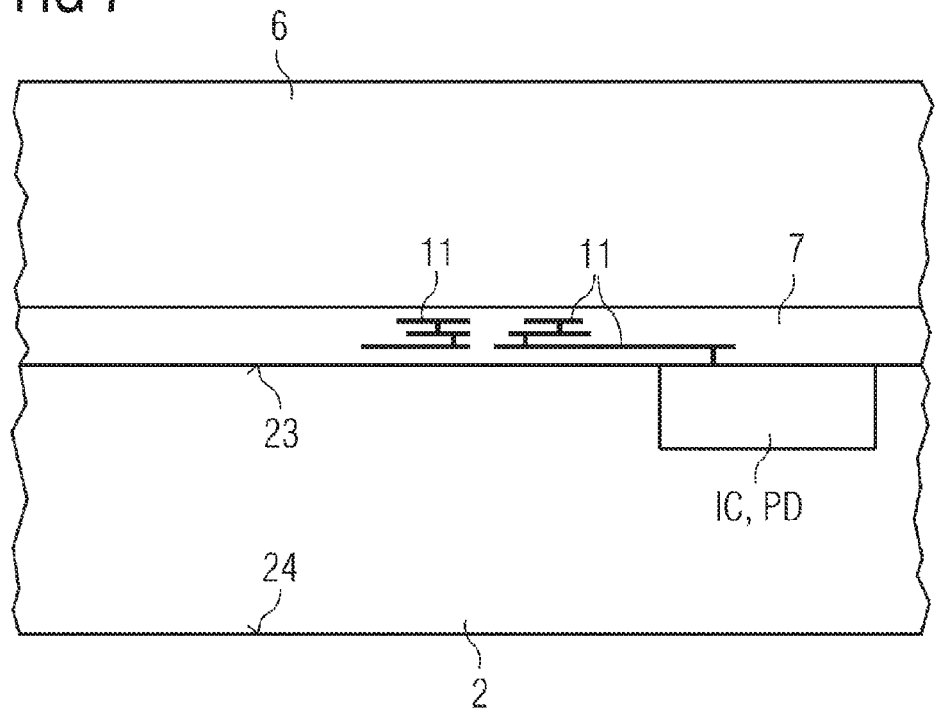
FIG. 7 shows a cross section of an exemplary embodiment of a second layer.

FIG. 7 is a cross section of the second layer 2 which constitutes an active interposer with a dielectric layer 7 and embedded metal layers on its main surface 23. An integrated circuit, for example, control device IC, or light-detector PD can be connected to the metallization structured topology 11 comprising several metal layers, which serve as a wiring. Manufacture is facilitated if a handling wafer 6 is fastened to an upper surface of the dielectric layer 7. A through-silicon via (TSV) connection is produced from the further main surface 24 of the second layer 2, opposite the dielectric layer 7.

Figure 8:
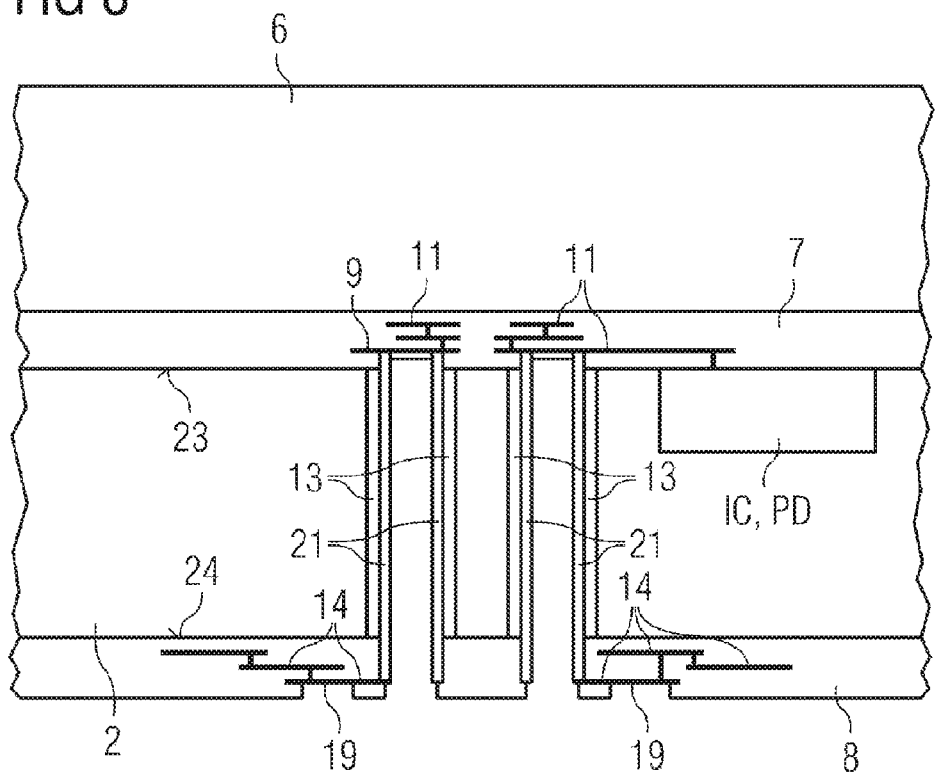
FIG. 8 shows a cross section according to FIG. 7 after the formation of the through-silicon via (TSV) connection.

FIG. 8 is a cross section according to FIG. 7 after the formation of the through-silicon via (TSV) connection. A further dielectric layer 8 is arranged above the further main surface 24. The through-silicon via (TSV) connection can be produced by etching a via hole through the further dielectric layer 8 and the second layer 2, until a contact area 9 of one of the metal layers 11 is uncovered. A sidewall insulation 13 can be formed in the via hole, and a metallization is applied in the via hole, so that the metallization electrically contacts the contact area 9. The metallization yields the electrically conductive interconnection of the through-silicon via (TSV) connection 21. At least one further metal layer 14, for example, a redistribution layer, which is connected to the through-silicon via (TSV) connection 21, is arranged in or on the further dielectric layer 8. The inner volume of the through-silicon via (TSV) connection 21 can be filled with the material that is applied to form the further dielectric layer 8, which may be an oxide or nitride of semiconductor material, for instance. A further contact area 19 of the further metal layer 14 can be provided for an external electrical connection. The handling wafer 6 is then removed.

Figure 9:
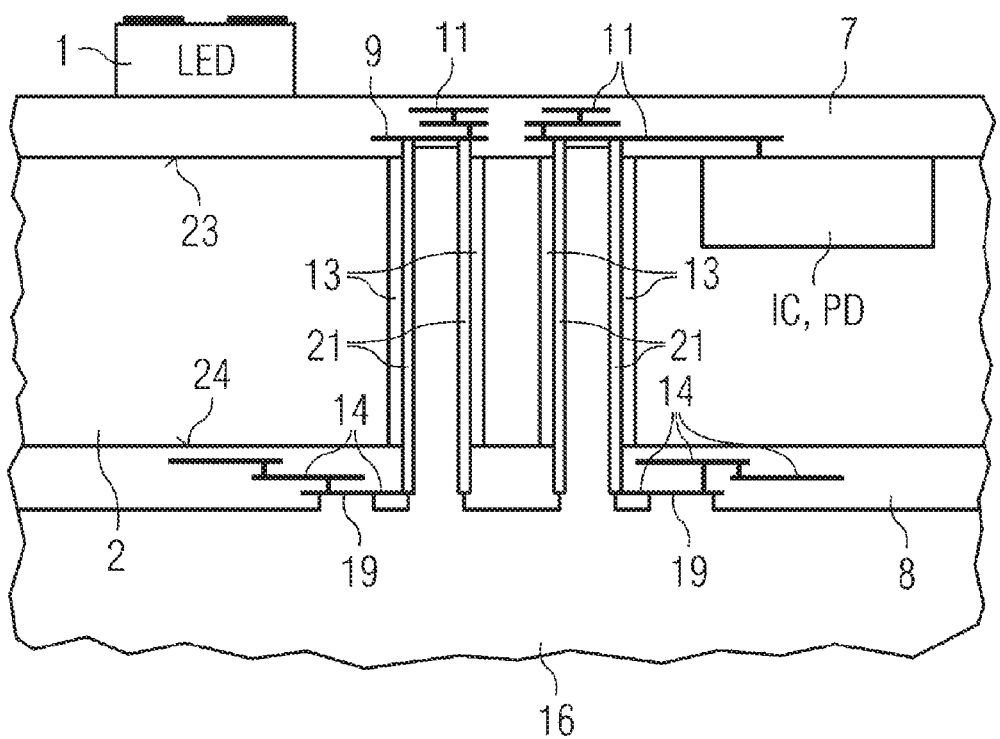
FIG. 9 shows a cross section according to FIG. 7 after the placement of chips like the light-detector PD or driver circuit IC.

FIG. 9 is a cross section according to FIG. 7 after the placement of chips like the light-detector PD or driver circuit IC. Manufacture is facilitated if a further handling wafer 16 is fastened to the further dielectric layer 8. A chip like the first layer 1 comprising the light-emitting device LED is mounted on the dielectric layer 7. Any number of chips can thus be mounted above the main surface 23.

The invention claimed is:

1. An optical proximity sensor arrangement, comprising a three-dimensional integrated circuit further comprising:
   a first layer comprising a light-emitting device, a second layer comprising a light-detector and a driver circuit electrically connected to the light-emitting device and to the light-detector and configured to control the operation of the light-emitting device and the light-detector and wherein the second layer comprises a second light barrier further comprising through silicon vias designed into a substrate, and
   a mold layer comprising a first light-barrier between the light-emitting device and the light-detector configured to block light from being transmitted directly from the light-emitting device to the light-detector.

2. The optical sensor arrangement according to claim 1, wherein the mold layer comprises an optically opaque mold material.

3. The optical sensor arrangement according to claim 1, wherein the mold layer comprises a wafer-level mold structure.

4. The optical sensor arrangement according to claim 1, wherein the mold layer is at least partially connected to a main surface of the second layer and comprises a first aperture to which the first layer is attached such that light from the light-emitting device can be emitted through the first aperture.

5. The optical sensor arrangement according to claim 4, wherein the mold layer comprises a second aperture to which the light-detector is attached such that light can reach the light-detector to be detected.

6. The optical sensor arrangement according to claim 1, wherein the second layer comprises the substrate into which the light-detector and the driver circuit are integrated.

7. The optical sensor arrangement according to claim 6, wherein the substrate comprises an active interposer, in particular connected to a redistribution layer or an embedded wafer level ball grid array.

8. The optical sensor arrangement according to claim 1, wherein the light-emitting device is electrically connected to the second layer by means of a metallization structured topology, a bond wire or a redistribution layer.

9. The optical sensor arrangement according to claim 1, wherein
   the first layer is stacked onto the main surface of the second layer or
   the first layer is embedded into a recess formed in the second layer or
   the first layer is stacked onto a further main surface of the second layer opposite to the main surface and wherein the first aperture extends through the second layer.

10. The optical sensor arrangement according to claim 1, wherein the light-detector and/or light-emitting device are covered by an optical element and wherein the optical element is a lens and/or zone plate, in particular a nano-imprinted lens.

11. A method of producing an optical proximity sensor arrangement, comprising the steps of:
   integrating a light-emitting device into a first layer,
   integrating a light-detector and a driver circuit into a second layer wherein the second layer comprises a second light barrier further comprising through silicon vias designed into a substrate,
   electrically connecting the light-emitting device to the driver circuit and to the light-detector,
   molding a mold layer comprising a first light-barrier between the light-emitting device and the light-detector configured to block light from being transmitted directly from the light-emitting device to the light-detector and
   integrating the first layer, the second layer and the mold layer into a three dimensional integrated circuit.

12. The method according to claim 11, wherein the molding involves molding at a waver-level, in particular using an optically opaque material.

13. The method according to claim 11, wherein
   the first layer is stacked onto the second layer, in particular stacked by means of die-to-wafer stacking and the first layer is electrically connected to the second layer by means of a metallization structured topology, a bond wire or a redistribution layer, in particular by means of a metallization structured topology with through-silicon-vias, or
   the first layer is embedded into a recess formed in the second layer.

14. The method according to claim 11, further comprising the steps of
   connecting the mold layer at least partially to a main surface of the second layer and providing a first aperture in the mold layer to which the first layer is attached such that light from the light-emitting device can be emitted through the first aperture and/or
   provide a second aperture to which the light-detector is attached such that light can reach the light-detector to be detected.

* * * * *